United States Patent [19]

Kinch et al.

[11] Patent Number: 5,043,293
[45] Date of Patent: Aug. 27, 1991

[54] DUAL OXIDE CHANNEL STOP FOR SEMICONDUCTOR DEVICES

[75] Inventors: Michael A. Kinch, Dallas; Arturo Simmons, Garland, both of Tex.

[73] Assignee: Texas Instruments Incorporated, Dallas, Tex.

[21] Appl. No.: 532,153

[22] Filed: Jun. 1, 1990

Related U.S. Application Data

[60] Continuation of Ser. No. 442,400, Nov. 27, 1989, abandoned, which is a continuation of Ser. No. 769,993, Aug. 26, 1985, abandoned, which is a division of Ser. No. 607,352, May 3, 1984, abandoned.

[51] Int. Cl.[5] .......................................... H01L 21/302
[52] U.S. Cl. ...................................... 437/37; 437/53; 437/70; 437/185; 357/24
[58] Field of Search ........................ 437/37, 53; 357/24

[56] References Cited

U.S. PATENT DOCUMENTS

| | | | |
|---|---|---|---|
| 3,434,868 | 3/1969 | Jorgensen | 148/DIG. 118 |
| 3,463,974 | 8/1969 | Kelley et al. | 357/23.11 |
| 3,649,886 | 3/1972 | Kooi | 357/52 |
| 3,787,251 | 1/1974 | Brand et al. | 357/23.11 |
| 4,231,149 | 11/1980 | Chapman et al. | 357/61 |
| 4,323,589 | 4/1982 | Roy et al. | 427/93 |

OTHER PUBLICATIONS

Sze, *Physics of Semiconductor Devices*, Wiley, N.Y. © 1981, pp. 412-416.
Cook, "Anodizing Silicon is Economical Way to Isolate IC Elements", *Electronics*, Nov. 13, 1975, pp. 109-113.

Primary Examiner—Olik Chaudhuri
Assistant Examiner—Long Pham
Attorney, Agent, or Firm—Melvin Sharp; James T. Comfort; N. Rhys Merrett

[57] ABSTRACT

The disclosure relates to oxide-semiconductor interfaces which are grown with varying amounts of fixed positive (or negative) charge. The invention utilizes these different values to form a channel stop for a charge transfer device. For HgCdTe two different oxides are used, namely, those produced by wet anodization (having large values of fixed positive charge) and plasma oxidation (having low values of fixed charge). The voltage range of operation of the active gate is determined by the difference in fixed positive charge for these regions and the insulator thicknesses.

13 Claims, 2 Drawing Sheets

DUAL OXIDE CHANNEL STOP FOR SEMICONDUCTOR DEVICES

This application is a Continuation, Division of application Ser. No. 07/442,400, filed 11/27/89 which is a continuation of 06/769,993 of 8/26/85 which is a division of 06,607/352 of 5/3/84, all now abandoned.

BACKGROUND OF THE INVENTION

1. Field of the Invention

This invention relates to channel stops for isolating semiconductor devices on a single substrate and, more particularly, to channel stops for isolating plural charge transfer devices (CTD) formed on a single semiconductor substrate.

2. Description of the Prior Art

Channel stops for use in semiconductor devices have been on many forms in the prior art. Channel stops are utilized to isolate plural active MOS devices from each other in a single substrate as is well known. Typically, in HgCdTe (MCT) semiconductor devices, such isolation is provided by a metal gate level which is placed in the region above where the channel stop is to be located in the semiconductor material. This metal gate level which is closer to the semiconductor material than the active metal gates, is biased to some potential such that the semiconductor surface directly underneath it will be accumulative or near flat band. Then, when proper voltage is applied on the active gate above that channel stop region, the surface underneath the channel metal level gate or fieldplate is controlled by the field gate voltage and not by the active gate voltage. The voltage on the field plate must be such as to hold the region thereunder either in accumulation or flat band condition to act as a channel stop. In the case of P-type silicon, either the above described method can be used or an implant can be placed in the channel stop region which is a heavy doping of P-type material (acceptoral) so that, when a voltage is placed on the active gate, the region between active devices is heavily doped and has a different turn on voltage than the active regions to provide device isolation. This procedure cannot be used in MCT because it results in tunneling problems.

The channel stop metal is the lowest metal level in the device being formed and in the channel stop region it must be lower level. The first level of metal that the active region sees is the gate metal.

These prior art methods have certain disadvantages. It is apparent that, if a metal level must be used between active devices, then, in turn, this metal level must be covered with an insulating layer prior to formation of the gate metal. This means that there is an increase in insulator thickness above the active region, resulting in lower well capacity and insulator capacitance.

It is also apparent that additional processing steps are required in adding the extra metal and insulator levels, such extra steps also resulting in decreasing semiconductor device yields and adding to processing costs as is well known in the art. It is therefore apparent that removal of the metal in the channel stop region and the processing steps required therefor has advantages in terms of yield and from a device capacity point of view.

SUMMARY OF THE INVENTION

In accordance with the present invention, there is provided a method of producing semiconductor devices having channel stops between active regions which materially reduces or eliminates the problems described hereinabove with regard to the prior art methods.

Briefly, in accordance with the present invention, two different side by side insulating layers are provided at the semiconductor material surface, one insulating layer being disposed above the active region and the other insulating layer being disposed at least in part above the channel stop region. The oxides typically used in MCT are known to have a fixed positive charge thereon, the quantity of charge being dependent upon the type of oxide region as well as its thickness. This means that, if a plot is made of the capacitance of a gate region versus gate voltage, a variation of capacitance with voltage will be seen which has a flat band or threshold voltage at a negative value because the charge in the oxide layer is positive A negative voltage is required to overcome the effect of the positive charge. Therefore, if different amounts of fixed positive charge are present in the oxide-MCT interface, then the threshold voltage will move around, depending upon the amount of charge in the oxide. Therefore, assuming P-type MCT is being used, the entire surface of the MCT is wet anodized with KOH or $H_2O_2$ in known manner to provide an anodic oxide layer having a relatively high fixed positive charge of about $10^{12}$ per square centimeter. Accordingly, the flat band voltage using such anodic oxide layer is negative and, depending upon the insulator thickness, preferably 700 angstroms of oxide and 1200-1500 angstroms of zinc sulfide thereover, this combination tends to provide a flat band voltage of about three to four volts negative as the transition voltage.

A pattern is then provided, such as with a photoresist, and etching takes place selectively where the channel stop is to be located, the etched regions then having an oxide formed therein of a type which has a smaller positive charge therein such as an oxide layer which is generated by an oxygen plasma in known manner. Here the fixed positive charge is about $10^{11}$ per square centimeter. This means that the flat band voltage for the region where the plasma oxide is located is much closer to zero and in fact almost zero though negative. It is therefore readily apparent that, as the voltage on the metal over the active region is increased in a positive direction, the depletion region thereunder will form at about minus 4 volts, thereby causing the start of formation of a depletion region in the semiconductor at the interface of the semiconductor material and the anodized oxide. At this level and down to the threshold voltage of the plasma formed oxide, the region under the plasma formed oxide will still be in accumulation. Accordingly, with the voltage range on the gate between the threshold voltage of the anodized oxide region and the threshold voltage of the plasma oxide region, the region beneath the plasma oxide region and beneath the gate acts as a channel stop.

DESCRIPTION OF THE PREFERRED EMBODIMENTS

Figure 1:
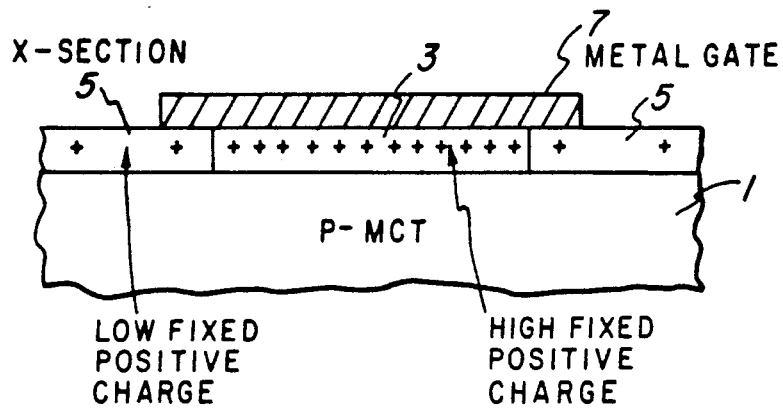
FIG. 1 is a cross-sectional side view of a P-type mercury cadmium telluride charge transfer device in accordance with the present invention.
Figure 2:
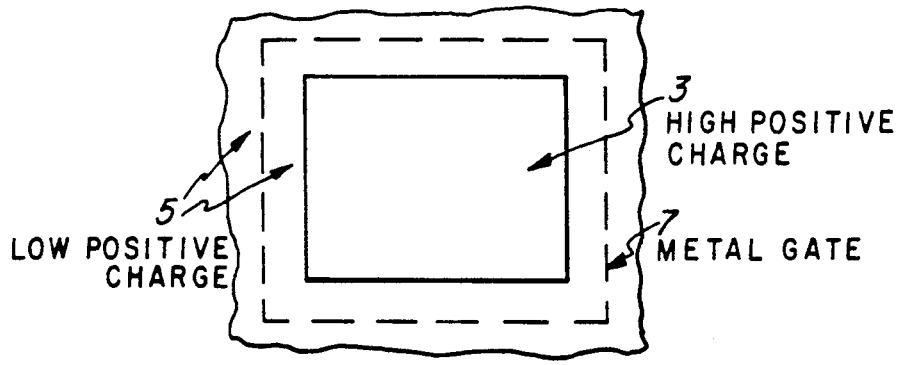
FIG. 2 is a top view of the embodiment of FIG. 1.

Referring first to FIGS. 1 and 2, there is shown a schematic diagram of a P-type MCT charge transfer device utilizing a dual oxide channel stop. The embodiment includes a substrate of P-type MCT 1 having an oxide region thereon of relatively high fixed positive charge 3, the latter being flanked or surrounded by regions of relatively low fixed positive charge 5. A metal gate 7 of standard form is positioned over the region of high positive charge 3 and overlaps a portion of the region of low fixed positive charge 5 on either side of or surrounding the region 3.

Figure 5:
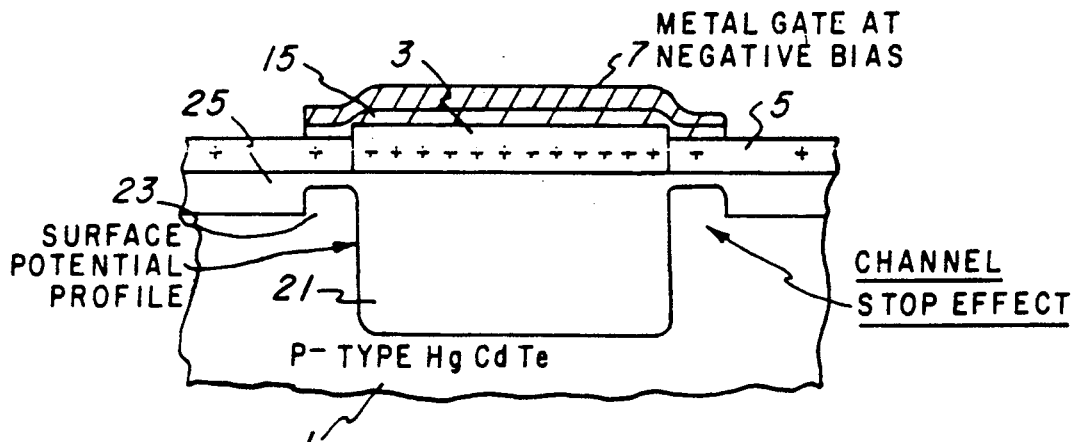
FIG. 5 is a cross-sectional diagram of a completed charge transfer device in accordance with the present invention and surface potential therein.
Figure 3:
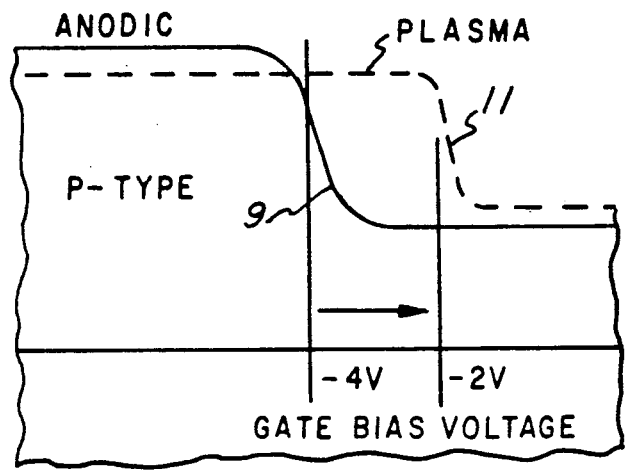
FIG. 3 is a graph showing the capacitance at each of the oxide regions as a function of voltage on the metal gate.
Figure 4:
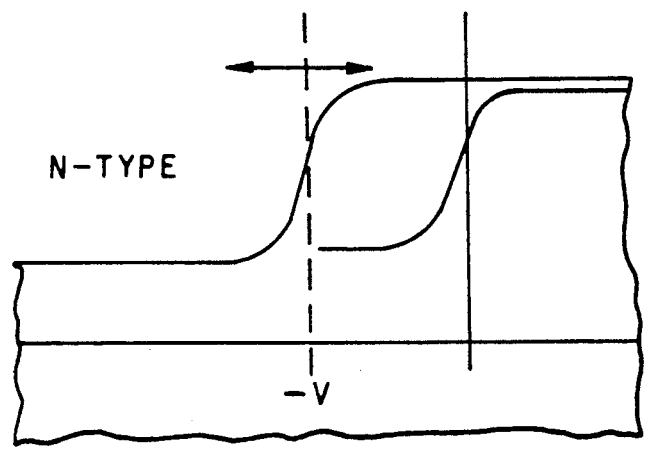
FIG. 4 is a diagram as in FIG. 3 but for an N-type mercury cadmium telluride device.

The principle of operation of the charge transfer device as depicted in FIGS. 1 and 2 for a P-type MCT substrate will now be discussed with reference to FIG. 3. The high positive fixed charge associated with the active gate area oxide 3 provides a flat band ($V_{FB}$) of transition voltage which is large and negative as shown at 9 in the graph of FIG. 3. The low fixed positive charge associated with the non-active area 5 of FIGS. 1 and 2 has a flat band voltage close to zero as shown at 11 in the graph of FIG. 3. Therefore, when the gate electrode 7 is maintained at its operating voltage which is typically about one volt in excess of threshold or one volt closer to zero than $V_{FB}$ or 9 on the graph of FIG. 3 and in the range between the transition voltages for both oxides, the active region is driven into depletion as shown in the surface potential diagram for the substrate 1 in FIG. 5 whereas the surrounding surface potential is still accumulated under the area covered by the metal gate 7. The low fixed positive charge region 23 under the metal gate thus acts as a channel stop. Outside the channel stop region 25, the surface will be inverted due to the residual fixed positive charge in the oxide. Even though the positive charge is in fact low, it is still positive and therefore will tend to invert the P-type substrate therebelow.

The same principles as described hereinabove can be applied to an N-type MCT substrate, though the oxides are then reversed with the channel stop region having the high fixed positive charge in the oxide thereover and the active region having the low fixed positive charge in the oxide thereover. As in the above described embodiment, however, the channel stop region will only exist at that area of the substrate wherein the metal gate and high fixed positive charged oxide overlap.

The advantages of this invention are apparent from a comparison of the alternative techniques used in infrared charge transfer devices. The prior art has utilized an electrostatic control field plate and a stepped insulator. The field plate has the problem that it is a metal level below the first gate metal and hence tends to make the thickness of insulator utilized underneath this first gate thicker so as to prevent interlevel and substrate short circuits. This has a strong effect on available well capacity. For P-type devices with fixed positive charge at the oxide-semiconductor interface, the field plate also must be operational.

The stepped insulator will provide a channel stop but its range is very limited in that the height of the step is limited due to metal step coverage problems. This technique cannot be used in an optimum fashion on P-type material with fixed positive charge at the interface.

The dual oxide technique described hereinabove overcomes these problems and results in a planar device with a sizeable voltage range available for gate operation. Typical differences in fixed positive charge are $10^{12}$ per square centimeter versus $10^{11}$ per square centimeter.

Referring again now to FIG. 5, there is shown a portion of a charge transfer device which would typically be one of an array of such devices in a single substrate such as, for example, a 64 by 64 element array. The substrate herein is P-type mercury cadmium telluride 1 having an oxide layer 3 over the active region having a large positive charge of approximately $10^{12}$ per square centimeter and an oxide layer 5 of smaller positive charge of approximately $10^{11}$ per square centimeter. A zinc sulfide layer 15 is disposed over the oxide layers 3 and 5 and a metal electrically conductive contact 7 which is preferably semi-transparent nickel or opaque aluminum is disposed over the zinc sulfide. In addition, a further zinc sulfide layer is formed followed by a further layer of aluminum and a further zinc sulfide insulating layer. Conductors thereon of indium or the like contact the contacts 7 or the further aluminum layer via formed vias in standard manner.

Charge transfer devices of this type described hereinabove are produced in the following manner. For a P-type MCT device, a mercury cadmium telluride substrate of P-type is provided and, initially, the top surface thereof is wet anodized, preferably with KOH or $H_2O_2$ to a uniform thickness of approximately 800 angstroms. This oxide is then patterned with a photoresist to delineate the active gate regions and the exposed oxide is etched away with lactic acid. The remaining photoresist is then removed and the substrate is placed in a plasma rig and the plasma oxide is grown over the entire surface to a thickness of about 200 to 300 angstroms in standard manner. Zinc sulfide is then evaporated over the oxidized structure to provide a layer of zinc sulfide in the region of 1200 to 1500 angstroms to provide an hermetic seal for the anodic oxide. An electrically conductive layer is then formed over the zinc sulfide, this being semitransparent nickel having a thickness of about 50 to 100 angstroms when a transparent contact is desired or an opaque aluminum layer of about 1200 angstroms when a transparent layer is not required. Further processing steps of standard type including two further layers of zinc sulfide of about 1200 angstroms with a 1200 angstrom aluminum layer therebetween is formed. Indium contacts to the electrode 7 and further aluminum layer are formed in known manner to complete the device.

As stated above, the processing steps discussed hereinabove would be reversed in terms of patterning of the oxide where N-type substrates are utilized.

The above noted processing procedure is not limited to the use of plasma and KOH or $H_2O_2$ wet oxides, but can be implemented with a variety of surface treatment combinations, such as a combination of different wet oxides or of two different plasma oxides or an oxide together with a surface treatment which leaves the surface in a known stable state of charge. The only requirement is that the two oxide layers formed have significantly different positive charge levels.

With reference again to FIG. 5, it can be seen that the completed device has a surface potential profile such that a channel stop effect takes place in the region of low positive charge oxide only beneath the metal gate for P-type MCT with appropriate apparent changes being noted for N-type substrates.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of forming a semiconductor device, comprising the steps of:
   (a) providing a substrate of p-type mercury cadmium telluride
   (b) forming a first oxide layer on a portion of a surface of said substrate, said first oxide layer having a predetermined fixed positive charge therein,
   (c) forming a second oxide layer on said surface of said substrate adjacent said first oxide layer having a fixed positive charge therein greater than said fixed charge in said first layer if said substrate is N-type and less than said fixed charge if said substrate is P-type, and
   (d) forming a continuous electrically conducting layer over said first oxide layer and a portion of said second oxide layer most closely adjacent said first layer is said substrate is P-type and over said second oxide layer and a portion of said first oxide layer most closely adjacent said second layer if said substrate is N-type.

2. The method of claim 1 wherein said first layer has a thickness of about 800 Angstroms.

3. The method of claim 2 wherein said second layer has a thickness of about 200 to about 300 Angstroms.

4. The method of claim 1 further including the step of placing a layer of zinc sulfide over said first and second layers prior to forming said electrically conducting layer.

5. The method of claim 2 further including the step of placing a layer of zinc sulfide over said first and second layers prior to forming said electrically conducting layer.

6. The method of claim 3 further including the step of placing a layer of zinc sulfide over said first and second layers prior to forming said electrically conducting layer.

7. The method of claim 1 wherein said substrate is P-type, the positive charge in said first layer is about $10^{12}$ per square centimeter and the positive charge in said second layer is about $10^{11}$ per square centimeter.

8. The method of claim 2 wherein said substrate is P-type, the positive charge in said first layer is about 10 per square centimeter and the positive charge in said second layer is about $10^{11}$ per square centimeter.

9. The method of claim 3 wherein said substrate is P-type, the positive charge in said first layer is about $10^{12}$ per square centimeter and the positive charge in said second layer is about $10^{11}$ per square centimeter.

10. The method of claim 4 wherein said substrate is a P-type, the positive charge in said first layer is about $10^{12}$ per square centimeter and the positive charge in said second layer is about $10^{11}$ per square centimeter.

11. The method of claim 5 wherein said substrate is P-type, the positive charge in said first layer is about $10^{12}$ per square centimeter and the positive charge in said second layer is about $10^{11}$ per square centimeter.

12. The method of claim 6 wherein said substrate is P-type, the positive charge in said first layer is about $10^{12}$ per square centimeter and the positive charge in said second layer is about $10^{11}$ per square centimeter.

13. A method of forming a semiconductor device, comprising the steps of:
   (a) providing a substrate of P-type mercury cadmium telluride,
   (b) forming a first oxide layer on a portion of a surface of said substrate, said first oxide layer having a predetermined fixed positive charge therein,
   (c) forming a second oxide layer on said surface of said substrate adjacent said first oxide layer having a fixed positive charge therein greater than said fixed charge in said first layer if said substrate is N-type and less than said fixed charge if said substrate is P-type, and
   (d) forming a continuous electrically conducting layer over said first oxide layer and a portion of said second oxide layer most closely adjacent said first layer if said substrate is P-type and over said second oxide layer and a portion of said first oxide layer most closely adjacent said second layer if said substrate is N-type,
   (e) further including the step of placing a layer of zinc sulfide over said first and second layers prior to forming said electrically conducting layer.

* * * * *